United States Patent
Moon et al.

(10) Patent No.: US 7,859,614 B2
(45) Date of Patent: Dec. 28, 2010

(54) LIGHT EMITTING DIODE PACKAGE HAVING DUAL LENS STRUCTURE AND BACKLIGHT FOR LIQUID CRYSTAL DISPLAY DEVICE IMPLEMENTING THE SAME

(75) Inventors: Won-Taek Moon, Gyeongsangbuk-Do (KR); Jun-Ho Bae, Gyeongsangbuk-Do (KR); Jae-Jin Kim, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 266 days.

(21) Appl. No.: 12/149,831

(22) Filed: May 8, 2008

(65) Prior Publication Data
US 2008/0278655 A1 Nov. 13, 2008

(30) Foreign Application Priority Data
May 9, 2007 (KR) .................. 10-2007-0045191

(51) Int. Cl.
*G02F 1/1335* (2006.01)
(52) U.S. Cl. ........................................ 349/69
(58) Field of Classification Search .............. 349/69
See application file for complete search history.

(56) References Cited
U.S. PATENT DOCUMENTS
2005/0045897 A1 * 3/2005 Chou et al. .................. 257/98
2005/0073849 A1 * 4/2005 Rhoads et al. .............. 362/296
2006/0034082 A1 * 2/2006 Park et al. ................... 362/268

* cited by examiner

Primary Examiner—David Nelms
Assistant Examiner—Phu Vu
(74) Attorney, Agent, or Firm—Morgan Lewis & Bockius LLP

(57) ABSTRACT

Disclosed is a liquid crystal display (LCD) device in which low power LEDs with a dual lens structure re configured for application in a backlight device to increase the optical efficiency at low power, thus enhancing the brightness, such LCD device including: a lower cover; PCBs (Printed Circuit Boards) disposed on the lower cover for receiving power from the exterior; a main body mounted on the PCBs; R, G and B LED (Light Emitting Diode) devices disposed on the main body for emitting light; a first lens having a first curvature and mounted on the main body and housing the R, G and B LED devices; a second lens covering the outside of the first lens and having an inner curved surface with a second curvature having a varying radius of curvature, and an outer curved surface with a third curvature, wherein the second curvature of the inner curved surface is gradually increased from an edge portion toward a central portion; and a liquid crystal panel spaced apart from the second lens by a certain interval and to which light is provided.

19 Claims, 7 Drawing Sheets

LIGHT EMITTING DIODE PACKAGE HAVING DUAL LENS STRUCTURE AND BACKLIGHT FOR LIQUID CRYSTAL DISPLAY DEVICE IMPLEMENTING THE SAME

The present disclosure relates to subject matter contained in priority Korean Application No. 10-2007-0045191, filed on May 9, 2007, which is herein expressly incorporated by reference in its entirety.

BACKGROUND OF THE INVENTION

1. Field of the Invention

The present invention relates to a light emitting diode (LED) package having a dual lens structure and a liquid crystal display (LCD) device implementing the same, and particularly, to an LCD device in which an array of low power LEDs having a compound dual lens structure are configured for advantageous application in a backlight module of low power so as to increase the optical efficiency and enhance the brightness.

2. Discussion of the Related Art

In general, a direct-type backlight used for a large size liquid crystal display model is configured to reflect light emitted from cold cathode fluorescent lamps on a reflecting plate to provide illumination to a liquid crystal panel disposed at a front surface thereof. Here, a diffusing sheet is additionally disposed in a light reflection path such that light can be locally emitted with a uniform luminance onto the LCD panel. However, such type of backlight becomes thicker, which causes the LCD device to become more complicated and bulky in its configuration and to become larger in its size.

Recently, as a surface light source which emits light only when current passes therethrough, a light emitting diode (LED) having characteristics such as a rapid response speed, low power consumption, a semi-permanent lifespan and the like, is utilized to thusly implement a thinner backlight and simultaneously enhance the brightness thereof. Above all, as compared with the existing cold cathode fluorescent lamps, the LED can present more natural colors and images with higher quality. Also, the LED can solve the problem of after-image for moving images and can be recognized as an environment-friendly product not using mercury. As a result, it can be employed as a core component of a next generation LCD so as to replace the cold cathode fluorescent lamp.

Hereinafter, a direct-type LED backlight of an LCD device according to the related art will be briefly described with reference to the accompanying drawings.

FIG. 1 is a cross-sectional view of an LCD device having a direct-type LED backlight device, and FIG. 2 is a plan view showing a plurality of PCBs (Printed Circuit Boards) fixedly arranged onto a lower cover of the LCD device in FIG. 1.

In the LCD device as shown in FIG. 1, a backlight unit is provided on a lower cover 30 disposed at a lower side of a main support frame 50 formed of molded resin or stainless steel (SUS STEEL) to have a square shape, and a liquid crystal panel 10 is stacked above the main support frame 50. An upper cover 60 encloses the edges of a front surface of the liquid crystal panel 10 and is assembled with the main support frame 50 and the lower cover 30.

The liquid crystal panel 10 includes a thin film transistor array on a substrate and a color filter substrate bonded together, and liquid crystal interposed therebetween.

As shown in FIGS. 1 and 2, the backlight unit for applying light onto the liquid crystal panel 10 includes an LED array 36 configured such that red, green and blue color (R, G and B) LED packages each of which includes a cluster of R, G and B LED chips for emitting light are linearly arranged along respective ones of a plurality of PCBs (Printed Circuit Boards) 34 disposed on the lower cover 30. A reflecting plate 32 is disposed on the entire lower surface at a region, in which the PCBs 34 are driven, for reflecting light. A diffusing plate 42 is disposed above the LED arrays 36 for diffusing light emitted from the LED arrays 36, and a prism sheet 44 is used in order to increase the luminous intensity of the light by refracting the light diffused by the diffusing plate 42. And a protection sheet 46 is disposed for protecting the prism sheet 44.

As such, the light emitted from the R, G and B LED chips composing each cluster is mixed together so as to generate white light. The white light is emitted to the outside of each cluster. Such emitted light is usually converged on a central portion of each cluster according to the emission characteristics related to the LED chip fabrication and the like.

However, such an arrangement in the related art backlight unit results in dimness and non-uniformity in the overall brightness of the backlight unit, and consequently a great number of such LEDs must be employed in order to obtain sufficient illumination, increasing the cost, power consumption and heat.

SUMMARY OF THE INVENTION

Therefore, in order to solve the above-mentioned problems of the related art, it is an object of the present invention is to provide an LED (Light Emitting Diode) package with a dual lens structure so as for light emitted from the LED package to be efficiently diffused more widely, and to provide a backlight unit for an LCD (Liquid Crystal Display) device implementing such LED package as a backlight device.

To achieve these and other advantages and in accordance with the purpose of the present invention, as embodied and broadly described herein, there is provided an LCD device including: a lower cover; PCBs (Printed Circuit Boards) to which external power is applied; a main body mounted on the PCBs; R, G and B LED devices disposed on the main body for emitting light; a first lens formed on the main body with a first curvature for housing the R, G and B LED devices; a second lens covering the outside of the first lens and having an inner curved surface having a varying radius of curvature, wherein the inner curved surface has a second curvature which is gradually increased from an edge portion thereof to a central portion thereof and its outer curved surface has a third curvature; and a liquid crystal panel disposed to be spaced apart from the second lens by a certain interval for receiving light applied thereto.

In one embodiment of the present invention, there is provided an LED package including: a main body having a recess in a central area thereof; R, G and B LED devices disposed on the main body for emitting light; a first lens disposed on the main body with a first curvature and housing the R, G and B LED devices; and a second lens covering the outside of the first lens and having an inner curved surface having a varying radius of curvature, wherein the inner curved surface has a second curvature which is gradually increased from its edge portion toward its central portion and its outer curved surface has a third curvature different from the second curvature of the inner curved surface.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Description will now be given in detail of an LED package having a dual lens structure and an LCD device having a backlight unit implementing the same according to the present invention, with reference to the accompanying drawings.

Figure 1:
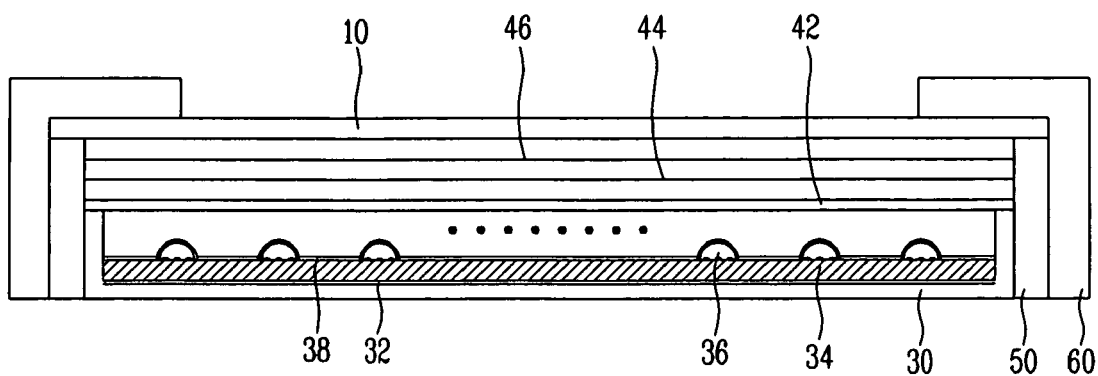
FIG. 1 is a cross-sectional view showing an LCD device having a direct-type LED backlight according to the related art.
Figure 2:
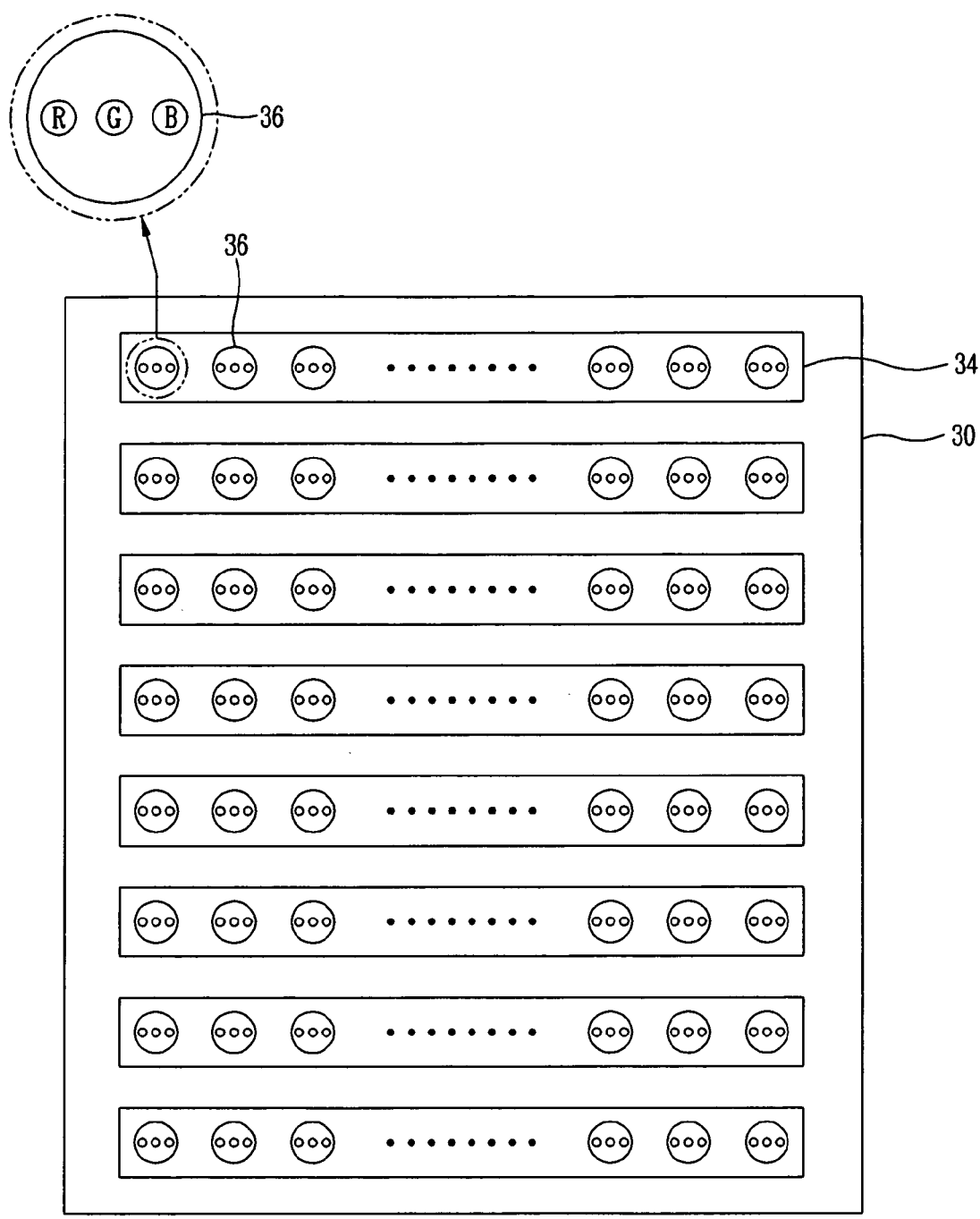
FIG. 2 is a plan view showing a plurality of PCBs fixedly arranged onto a lower cover of the LCD device in FIG. 1.
Figure 3:
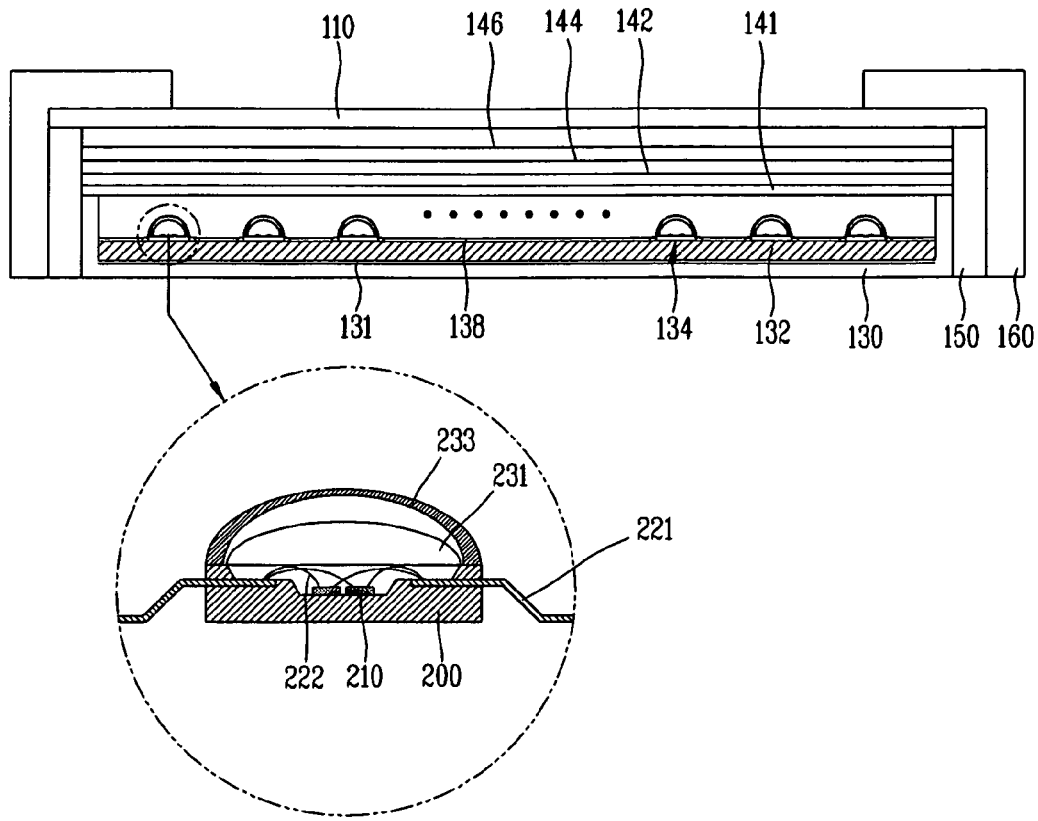
FIG. 3 is a cross-sectional view showing an LCD device having a direct-type LED backlight in accordance with a first embodiment of the present invention.

FIG. 3 is a cross-sectional view showing the configuration of an LCD device adopting a direct type LED backlight unit according to the present invention.

As shown in FIG. 3, a direct type LED backlight device for applying light toward a liquid crystal panel 110 is coupled onto a lower cover 130, and one or more first reflecting sheets or plates 131 are disposed on the lower cover 130 below or at least in between arrayed rows of LEDs composing the backlighting source.

In general, the reflecting sheet is formed of a white polyester film or a film having a metal (Ag, Al, etc.) coated thereon. Here, the optical reflectivity of visible rays on the reflecting sheet is about 90~97%. As the coated film becomes thicker, the reflectivity is increased.

On the lower cover 130 having the first reflecting plate 131 bonded thereto are uniformly arranged a plurality of metallized or metallic substrates 132, such as poly-based PCBs (Printed Circuit Boards) which are formed of, e.g., polyethylene or aluminum.

A second reflecting sheet 138 is disposed on the metallic substrates 132.

A plurality of LED chips 210 for each respectively emitting red, green and blue (R, G and B) light when an external voltage is supplied thereto are disposed on the metallic substrates 132. Here, triplets consisting of R, G and B LEDs each implements one cluster. Such a cluster is composed of a grouping of the R, G and B LEDs. Accordingly, the light emitted from each of the R, G and B LEDs is mixed together so as to compose white light. In other words, each RGB cluster serves as one light emitter which emits white light by the color combination (mixture) of the R, G and B light within the cluster.

Each RGB cluster is arranged within a dual lens (i.e., comprising lenses 231 and 233) to configure an LED package 134. As such, white light is emitted via the dual lens (i.e., 231 and 233) and diffused so as to be widely emitted, thereby exiting out of the dual lens (i.e., 231 and 233).

Here, in the present invention, on each of the metallic substrates 132 are disposed a plurality of LED packages 134 each having the R, G and B LEDs configured as one cluster. The number of LED packages each having the R, G and B LEDs configured as one cluster depends on the size of the liquid crystal panel to which the backlight will be mounted.

On each of the plurality of metallic substrates 132 on which the LED packages are disposed are stacked a diffusing plate 141 and a diffusing sheet 142 each spaced apart from the metallic substrates 132 with a certain interval so as to diffuse the light emitted from the RGB clusters of the LED packages 143, thereby generating more uniform light. Also, a prism sheet 144 for improving the directed brightness of the light transmitted through the diffusing plate 141 and the diffusing sheet 142 and a protection sheet 146 for protecting the prism sheet 144 are sequentially laminated. Here, the optical sheets such as the diffusing plate 141, the diffusing sheet 142, the prism sheet 144 and the protection sheet 146 may be optionally added or omitted in order to obtain desired optical characteristics.

The backlight device having such a configuration is coupled by a main support 150 coupled thereto at its upper side. The main support 150 maintains an overall balance of the LCD device so as to protect the LCD device from an external force or the like. The main support 150 is formed of molded resin or stainless steel so as to have a rectilinear frame. The upper surface of the main support 150 may be formed to have a stepped periphery in order to facilitate joining the liquid crystal panel 110 thereon.

On the main support 150 is laminated the liquid crystal panel 110 for representing data information by selectively passing the light emitted from the backlight. The liquid crystal panel 110 includes a pair of opposed transparent substrates with thin film transistors as switching devices arranged at each unit pixel or sub-pixel of a pixel matrix, a color filter, and liquid crystal interposed between the two substrates.

An upper cover houses the four edges of the liquid crystal panel 110, and is coupled both to the main support 150 and to the lower cover 130.

As described above, a backlight implementing the LED packages in accordance with the present invention with the dual lens structure in which the clusters each of the plurality of LEDs are configured emit light to illuminate the liquid crystal panel 110, such that images can be displayed by the liquid crystal panel 110. Such a RGB LED cluster will now be described in detail with reference to FIGS. 4 and 5.

Figure 4:
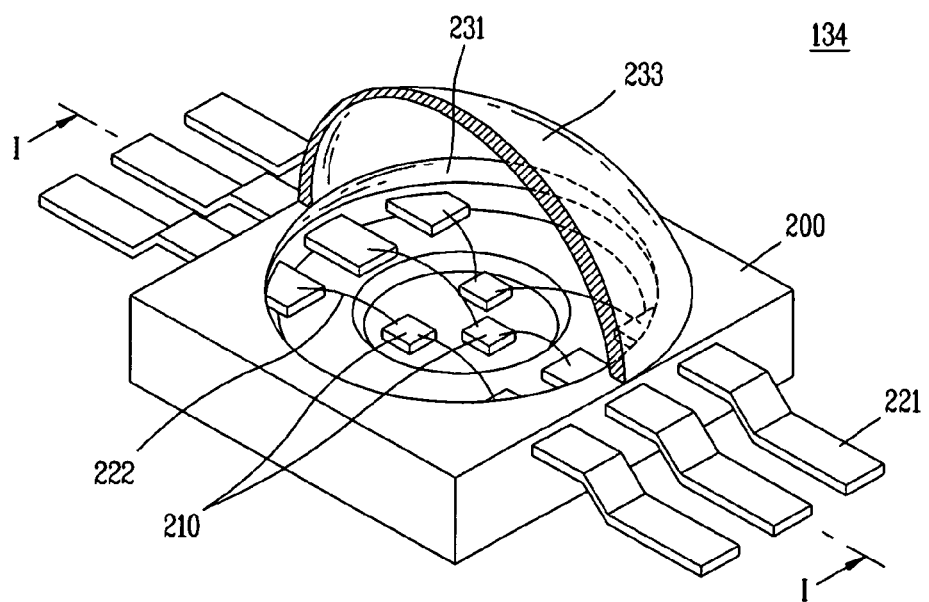
FIG. 4 is an enlarged perspective view of an LED package in the backlight of the LCD device of FIG. 3.
Figure 5:
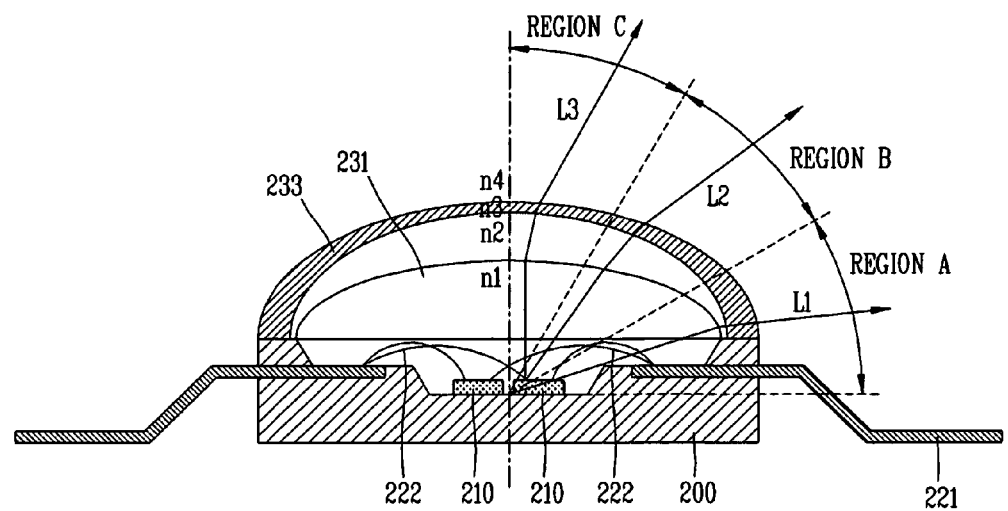
FIG. 5 is a ray diagram view showing a state where light is emitted within the LED package of FIG. 4.
Figure 6:
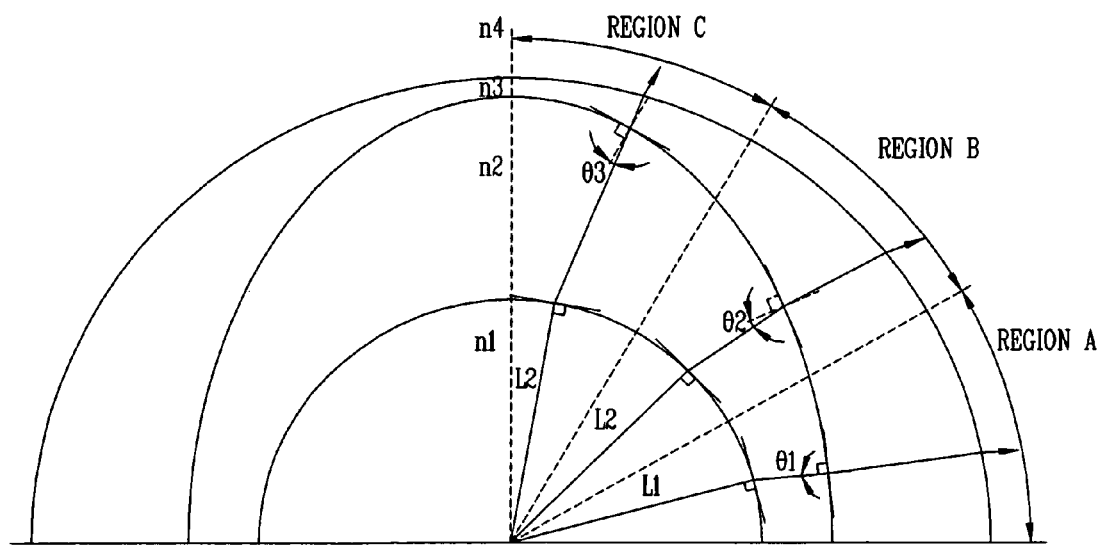
FIG. 6 is a ray diagram view showing a state where light is refracted at an outer curved surface of a ray diagram first lens and at an inner curved surface of a second lens shown in FIG. 5.

FIG. 4 is an enlarged perspective view of an LED package in the backlight of FIG. 3, FIG. 5 is a view showing a state where light is emitted within the LED package of FIG. 4, and FIG. 6 is a view showing a state where light is refracted at an outer curved surface of a first lens and at an inner curved surface of a second lens shown in FIG. 5.

As shown in FIGS. 4 and 5, the LED package 134 according to the present invention includes a main body 200 having a recess in its central area, R, G and B LED chips 210 mounted in the recess of the main body 200 to respectively emit R, G and B light, pair of conducting terminals or leads 221 and 222 respectively connected to each of the R, G and B LED chips 210 to supply power to the LED chips 210, a first lens 231 having a first curvature and housing the LED chips 210, and a second lens 233 disposed at the outside of the first lens 231 so as to house the first lens 231 and being a concavo-convexo or negative meniscus type lens having a thickness which is thicker at its central portion than at its edge portion.

The main body 200 is formed molding with the recess in its central area such that the plurality of LED chips 210 can be mounted therein. The main body 200 is molded by using a translucent resin or a resin with high reflectivity.

The main body 200 is provided with the external conducting terminals or leads 221 for electrically connecting the LED chips 210 therein to the outside. Here, in case where the R, G and B LED chips 210 are mounted at the main body 200, the external conducting terminals 221 may be implemented as three pairs of external conducting terminals 221, each respective pair being connected to the anode and cathode of corresponding LED chip 210. Also, the external conducting terminals 221 may connect the recess in the main body 200 to the outside via the inside of the main body 200, as shown in FIG. 4. In the alternative, the external conducting terminals 221 may be formed at an upper surface of the main body 200 to connect the recess in the main body 200 to the outside.

Each of the R, G and B LED chips 210 is mounted in the recess of the main body 200 and accordingly the R, G and B light emitted therefrom is mixed together so as to generate white light. Here, the R, G and B LED chips 210 may be arranged in a triangular formation as shown in the drawing. Alternatively, they may be arranged in a row, i.e., linearly or in any other spatial relationship to one another.

The main body 200 is provided in its recess with conducting wires, i.e., lead bonding wires, namely, internal conducting terminals 222 for electrically connecting the LED chips 210 to the external conducting terminals 221, respectively. Accordingly, an external voltage may be applied to each of the LED chips via the externally supplied conducting terminals 221 and the internal conducting terminals 222.

Also, the first lens 231 having the first curvature is provided over the LED chips 210 disposed in the recess of the main body 200. Here, a gel-type elastic resin made of silicone is filled in the first lens 231. The LED chips 210 are accordingly sealed, i.e., encapsulated such that no voids, namely, no hollow section exists between the LED chips 210 and the first lens 231.

Here, the gel-type elastic resin is hardened after being injected. Such hardened elastic resin can have good elasticity such that it can protect the LED chips 210 more stably from thermal stress, vibration, external impact and the like. In addition, the hardened elastic resin exhibits minimal change from single wavelength light, such as yellowing, while having high refractivity, thus exhibiting excellent optical characteristics.

Moreover, the first lens 231 may be designed, for example, in a spherical shape so as to decrease light which is emitted from the R, G and B LED chips 210 toward a side surface and then totally reflected in the first lens 231. Such design is employed for two purposes. For one purpose, the amount of light totally reflected in the first lens 231 is adjusted to control the mixing of the light emitted from the R, G and B LED chips 210, thereby creating white light. As for the other purpose, since the power consumption of the R, G and B LED chips 210 may differ depending on their types or the characteristics of the LED chips 210 may be a bit different depending on their manufacturer, a design considering such conditions is required.

In addition to the silicone for the first lens 231, a small amount of diffusing material, i.e., optical dispersant, may be additionally added to the silicone, such that the diffusing material can convert the optical path, thus increasing the optical mixing. Furthermore, a haze processing may be performed for the surface of the first lens 231 containing the silicone and the diffusing material, to maximize the optical mixing.

Still referring to FIGS. 4 and 5, the second lens 233 having an oval concave inner curved surface and a hemispherical convex outer curved surface is formed peripherally of and above the first lens 231. The second lens 233 is accordingly thin at its central portion and thicker toward its edge.

As such, as the second lens 233 is formed and attached to be spaced apart from the first lens 231 with a certain interval such that an empty space, i.e., a hollow section, exist between the second lens 233 and the first lens 231. Here, the first lens 231 and the second lens 233 have a differing interval therebetween. That is, the interval between the first and second lenses 231 and 233 at their central portions is greater than that at their edges.

The second lens 233 may be formed of any one of polycarbonate, polyethylene, EMC (Epoxy Molding Compound), silicone, epoxy resin or the like, or formed by combining two or more of such compounds by an injection molding.

In the present invention, the second lens 233 is preferably configured such that a second curvature, i.e., radius of curvature of its inner concave curved surface decreases from its central portion toward its edge, and a third curvature of its convex outer curved surface is smaller than the first convex curvature of the first lens 231.

Here, upon sweeping declinedly along the curved surface at a uniform angular rate from a certain point (optical point) at the central portion of the inner curved surface, the radius of curvature of the inner curved surface of the second lens 233 changes according to the angular declination, i.e., according to the arcuate length of the curved surface. At this moment, the radius of curvature is much shorter than the radius of curvature of the circle drawn upon sweeping inclinedly at a uniform angular rate along the curved surface from the edge portion of the second lens 233. In other words, the second curvature of the second lens 233 is greater at the central portion of its inner curved surface than at the edge portion of the inner curved surface.

Therefore, in the present invention, the second curvature of the inner curved surface of the second lens 233 is gradually decreased from the central portion toward the edge, which means that since the oval shape of the inner curved surface of the second lens 233 is implemented by arcs of circles having the above mentioned radii of curvature, the radius of curvature is the shortest at the convex part of the central portion while the radius of curvature is the greatest at the edge, and the radius of curvature is gradually increased in the intermediate area from the central portion toward the edge.

With such principle, the outer curvature surface of the second lens 233 has a greater radius of curvature than has the outer curved surface of the first lens 231. Accordingly, the third curvature of the outer curved surface of the second lens 233 is smaller than the first curvature of the first lens 231.

The structures of the first lens 231 and the second lens 233 will now be described in more detail with reference to FIG. 5.

Assuming that the central points (i.e., optical axes) of the first and second lenses 231 and 233 are perpendicular to the emitting faces of LED chips 210 on the main body 210, an area within a particular inclination angle range of about 30° from the upper planar surface of the main body 210 in a direction inclining toward the central points of the first and second lenses 231 and 233 is represented as Region A, an area within an inclination angle range of 30°~60° is represented as Region B, and an area within an inclination angle of 60°~90° is represented as Region C.

Here, in Region A, the interval between the first lens 231 and the second lens 233 is uniform within the overall area corresponding to Region A, while the interval is the narrowest as compared with the intervals therebetween in Region B and Region C. On the other hand, the second lens 233 is the thickest in Region A.

In Region B, the interval between the first lens 231 and the second lens 233 is uniform in the overall area corresponding to Region B, while the interval is greater than that in Region A but narrower than that in Region C. On the other hand, the thickness of the second lens 233 in Region B is thinner than that in Region A and thicker than that in Region C.

In Region C, the interval between the first lens 231 and the second lens 233 is uniform in the overall area corresponding to Region C, while the interval is the greatest as compared with the intervals in Region A and Region B. On the other hand, the second lens 233 is the thinnest in Region C.

Although the description above was given for the three regions divided for the sake of convenience, the interval between the first lens 231 and the second lens 233 is gradually increased linearly or non-linearly approximately from their edge portions toward their central portions. On the other hand, the thickness of the second lens 233 is gradually decreased linearly or non-linearly from its edge portion toward its central portion.

Here, the distance corresponding to the sum of the hollow section between the first lens 231 and the second lens 233 and the thickness of the second lens 233 is uniform in all of Regions A, B and C, which means that the distance from the outer curved surface of the first lens 231 to the outer curved surface of the second lens 233 is identical in all the regions.

The operation of the backlight device implementing the dual lens multicolor LED package according to the present invention will now be described based upon the difference in light refractivity (i.e., index of refraction "n") in each Region of the first lens 231 and the second lens 233 with reference to FIGS. 5 and 6.

As shown in FIG. 5, light is emitted from the R, G and B LED chips 210 with its optical path being changed by the diffusing material mixed in with the silicone in the first lens 231, thus to be mixed together.

Such mixed light is transmitted through the first lens 231 and the second lens 233 so as to be refracted commonly three times areas along its entire path. The first refraction occurs when light having been emitted from the LED chips 210 is incident on the hollow section via the first lens 231, the second refraction occurs when the light is incident on the inner curved surface of the second lens 233 via the hollow section, and the third refraction occurs when the light transmitted through the second lens 233 exits into the air from the outer curved surface of the second lens 233.

Generally, the light path depends on the refractivity. The present invention is implemented such that the refractivity n1 of the first lens 231, the air refractivity n2 in the hollow section, a refractivity n3 of the second lens 233 and the exterior air refractivity n4 outside of the second lens 233 are all the same in Regions A, B and C. Accordingly, the light path in Regions A, B and C are determined according to the curvature and thickness of the second lens 233, namely, the refractivity of the second lens 233.

As shown in FIGS. 5 and 6, a first emitted light ray L1 emitted in Region A from the LED chip 210 is incident on the hollow section from the outer curved surface of the first lens 231 so as to be refracted by a particular angle due to the difference between the refractivity n1 of the first lens 231 and the refractivity n2 of the air in the hollow section. The refracted first emitted light ray L1 is then incident on the inner curved surface of the second lens 233 via the short hollow section.

Here, because the incident first emitted light ray L1 is incident directly on (i.e., normal to the inner surface of) the second lens 233 there is no change in the light path at the inner curved surface of the second lens 233. Accordingly, the first emitted light ray L1 exits out of the second lens 233, hardly changing its path.

Description will be given in more detail with reference to the following Equation 1.

$$n2 \times \sin(\theta1) = n3 \times \sin(\theta1')$$ [Equation 1]

where n2 denotes the refractive index of the air in the hollow section, $\theta1$ denotes the incident angle of the light on the inner curved surface of the second lens 233, n3 denotes the refractive index of the second lens 233, and $\theta1'$ denotes the emission angle.

Here, since the refractive index n2 of the air in the hollow section is lower than the refractive index n3 of the second lens 233, the emission angle $\theta1'$ is always smaller than the incident angle $\theta1$.

As shown in FIG. 6, if a tangent line and a normal line perpendicular to the tangent line are drawn at a certain point on the inner curved surface of the second lens 233 at which the first emitted light ray L1 is incident in Region A, the incident angle $\theta1$ formed between the first emitted light ray L1 and the normal line is considerably small, and accordingly, the emission angle $\theta1'$ is much smaller.

Also, the first emitted light ray L1 refracted by the inner curved surface of the second lens 233 is then incident on the outer curved surface of the second lens 233. As a result, the first emitted light ray L1 exits to the side surface with a bit wider radiation width (as compared with the related art) according to the difference between the refractivity of the outer curved surface and the surrounding air refractivity.

In relation to this, the following Equation 2 applies.

$$n3 \times \sin(\theta1') = n4 \times \sin(\theta1'')$$ [Equation 2]

where n3 denotes the refractive index of the second lens, $\theta1'$ denotes the incident angle at the outer curved surface of the second lens 233, n4 denotes the refractive index of air surrounding the second lens, and $\theta1''$ denotes the emission angle.

Here, since the refractivity n3 of the second lens 233 is higher than the refractivity of the outside air, the emission angle $\theta1''$ should always be greater than the incident angle $\theta1'$.

However, although not shown in detail in FIG. 6, if a tangent line and a normal line perpendicular to the tangent line are drawn at a certain point on the outer curved surface of the second lens 233 at which the first emitted light ray L1 is actually incident in Region A, the incident angle $\theta1'$ formed between the first emitted light ray L1 and the normal line is not so great, and accordingly, the emission angle $\theta1''$ is not increased so much, either.

Thus, the incident angle $\theta1'$ of the first emitted light ray L1 on the outer curved surface of the second lens 233 in Area A is determined by the incident angle $\theta1$ of the first emitted light ray L1 on the inner curved surface of the second lens 233. Also, as the incident angle $\theta1$ of the first emitted light ray L1 on the inner curved surface of the second lens 233 is smaller, the incident angle θ1' of the first emitted light ray L1 on the outer curved surface of the second lens 233 also becomes smaller.

As a result, most of actual refraction occurring in Region A is induced by the refractivity difference between the outer curved surface of the second lens 233 and the outer air.

Regarding Region B, if it is considered that a second light ray L2 emitted from the LED chip 210 is incident perpendicularly on a tangent line formed by the outer curved surface of the first lens 231a and a certain point on which the second emitted light ray L2 is incident at the outer curved surface of the first lens 231, the second emitted light ray L2 in Region B is incident on the hollow section from the outer curved surface of the first lens 231 and accordingly the refraction occurs in Region B to the same degree as in Region A.

The refracted second emitted light ray L2 is incident on the inner curved surface of the second lens 233 from the hollow section by the relatively great hollow section as compared with that in Region A and the curvature of the second lens 233, such that the light path of the second emitted light ray L2 is changed greatly as compared with the first emitted light ray L1 in Region A. This will be understood from the aforesaid Equation 1.

Thus, light exits through the side surface due to the refractivity difference between the outer curved surface of the second lens 233 and the surrounding air, as can be understood from the aforesaid description.

Therefore, the second emitted light ray L2 in Region B is incident on the inner curved surface of the second lens 233 from the hollow section such that the path of the second light ray L2 is changed more than that of the first light ray L1 in Region A. This is because the radius of curvature of the inner curved surface of the second lens 233 in Region B is not shorter than the radius of curvature of the inner curved surface of the second lens 233 in Region A. In other words, the second curvature of the inner curved surface of the second lens 233 in Region B is greater than the second curvature of the inner curved surface of the second lens 23 in Region A.

Regarding in Region C, if it is considered that a third emitted light ray L3 from the LED chip 210 is incident perpendicularly on a tangent line formed at the outer curved surface of the first lens 231 and a certain point at which the third emitted light ray L3 is incident at the outer curved surface of the first lens 231, the third emitted light ray L3 in Region C is incident on the hollow section from the outer curved surface of the first lens 231 so as to be refracted to the same degree as in Regions A and B.

The refracted third emitted light ray L3 is incident on the inner curved surface of the second lens 233 from the hollow section such that its path is changed more than those of the first emitted light ray L1 in Region A and the second emitted light ray L2 in Region B, which results from that the third emitted light ray L3 in Region C depends on the relatively long hollow section and the second curvature of the second lens 233 as compared with Region A and Region B. This will be apparent from the aforesaid Equation 1.

The third emitted light ray L3 then exits through the side surface due to the refractivity difference between the outer curved surface of the second lens 233 and the surrounding air, as can be understood from the aforesaid description.

Thus, the third emitted light ray L3 in Region C in which the inner curved surface of the second lens 233 has a radius of curvature smaller than those in Region A and Region B, namely, as the second curvature becomes greater. Accordingly, the light path is changed much more at the inner curved surface, which results in a reduction of the light intensity at the central portion of the second lens 233.

Consequently, the light emitted from the R, G and B LED chips 210 into Region B and Region C is diffused even into Area A via the first and second lenses 231 and 233. Ultimately, the light passing through the second lens 233 can have the characteristic of being emitted over an angle of approximately 30° to 90° with respect to the planar surface of the main body 200 (i.e., from the horizontal).

A method of fabricating the LED package having such structure will be described with reference to FIGS. 7A and 7B.

Figure 7A:
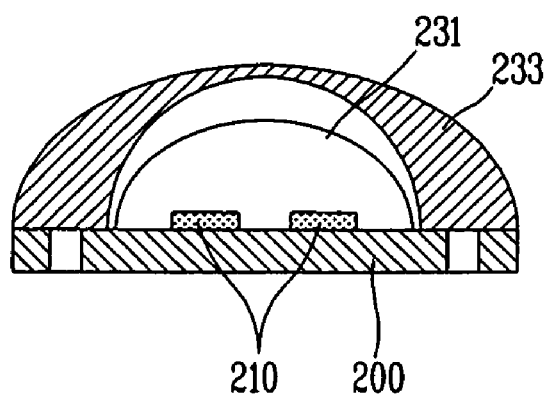
FIGS. 7A and 7B are views, respectively, showing steps of process of fabricating a PCB having an LED package disposed thereon in accordance with one embodiment of the present invention.

First, as shown in FIG. 7A, the R, G and B LED chips 210 are mounted in the recess of the main body 200. A gel-type elastic resin is injected into the recess to be hardened, thereby forming the first lens 231.

The second lens 233 which is separately fabricated by an injection molding is fixed onto the main body 200. Here, the main body 200 and the second lens 233 are fixed to each other by coupling means such as a hole and a hook or by an adhesive member.

Figure 7B:
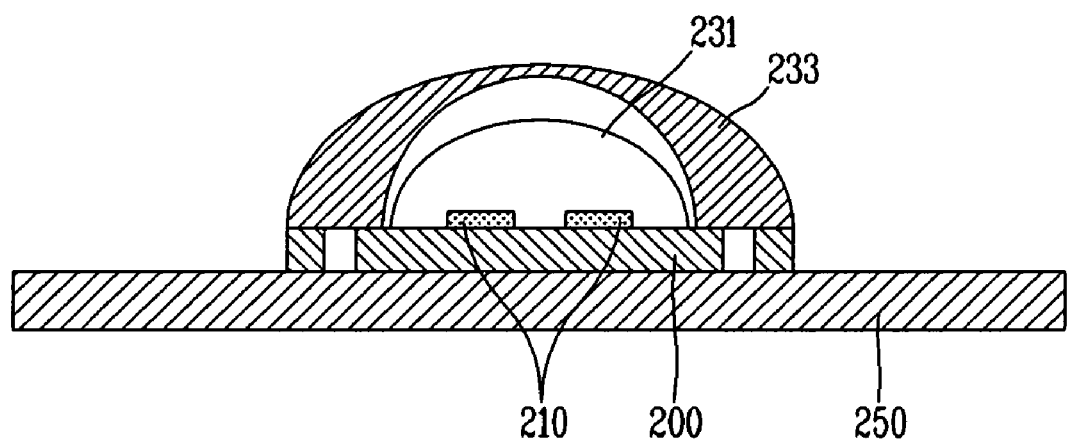

Such thusly formed LED package is fixed onto a metallic substrate 250 made of aluminum or onto a poly-based PCB, as shown in FIG. 7B, so as to be supplied a voltage from the exterior, for thus emitting light.

Figure 8A:
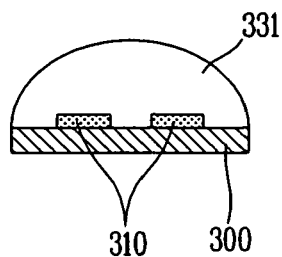
FIGS. 8A, 8B and 8C are views, respectively, showing steps of a process of fabricating a PCB having an LCD package disposed thereon in accordance with another embodiment of the present invention.
Figure 8B:
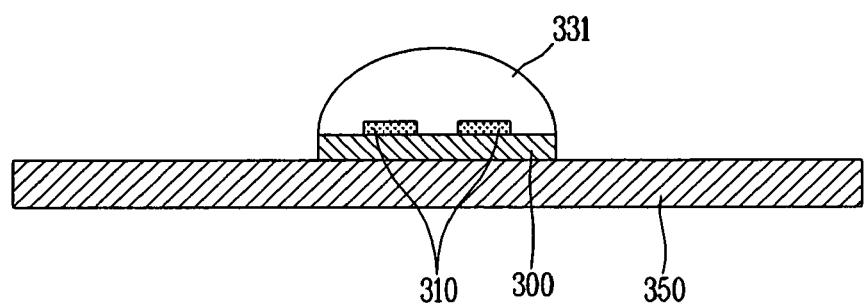
Figure 8C:
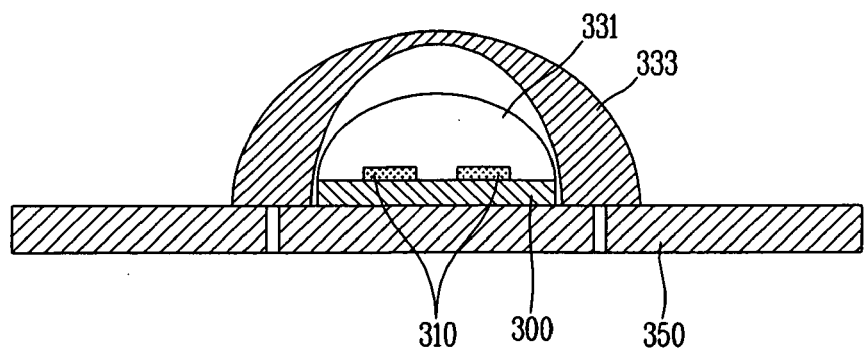

Also, an LED package according to the present invention may be fabricated by processes as shown in FIGS. 8A to 8C.

First, R, G and B LED chips 310 are mounted in a recess of a main body 300 having a square shape as shown in FIG. 8A. A gel-type elastic resin is injected into the recess to be hardened, thereby forming a first lens 331.

As shown in FIG. 8B, the main body 300 having the first lens 331 thereon is coupled onto a metallic substrate 350 or a poly-based PCB.

Afterwards, as shown in FIG. 8C, a second lens 333 separately fabricated by an injection molding is fixed onto the metallic substrate 350. Here, the second lens 333 and the metallic substrate 350 are coupled to each other by separate coupling means such as a hole in the metallic substrate 350 and a hook on the second lens 333.

With this configuration, the LED chips 310 can emit light when an external voltage is applied to the metallic substrate 350.

Figure 9:
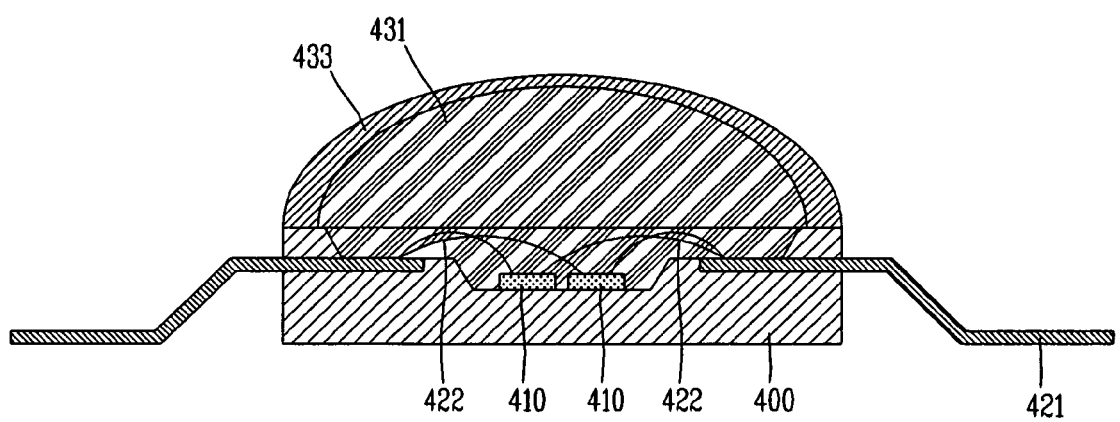
FIG. 9 is a cross-sectional view showing an LED package in accordance with a second embodiment of the present invention.

FIG. 9 is a cross-sectional view showing an LED package of an LCD device in accordance with a second embodiment of the present invention.

As compared with FIGS. 4 and 5, the LED package according to the second embodiment of the present invention includes a main body 400 implementing a periphery with a recess in its central portion, R, G and B LED chips 410 mounted in the recess in the main body 400, respective conducting terminals 421 and 422 connected to the R, G and B LED chips 410 to apply voltages thereto, a first lens 431 formed on the LED chips 410 and having a first curvature which is gradually increased from its edge portion toward its central portion, and a second lens 433 formed at the edge and the central portion of the first lens 431 wherein its inner curved surface has a second curvature which is gradually increased from the edge portion toward the central portion and its outer curved surface has a third curvature which is gradually decreased from the edge portion toward the central portion.

Here, when the first lens 431 having the first curvature which is gradually increased from the edge portion toward the central portion is the same as that of the second lens 433, which is formed at the edge and the central portion of the first lens 431 and has the inner curved surface with the second curvature which is gradually increased from the edge portion toward the central portion, the first lens 431 contacts the second lens 433.

Here, the first lens 431, which is formed of a gel-type elastic resin to be spherical and the second lens 433 formed by an injection molding to be spherical are respectively formed of a material which can vary both the second curvature and their refractivities at the portion where the first lens 431 and the second lens 433 come in contact with each other. Accordingly, the same effect as aforementioned can be expected.

Other details can be understood from the aforementioned description.

Now, although not shown in any additional drawing, an LED package of a backlight for an LCD device which is a variation of the first embodiment of the present invention will be described.

As compared with FIGS. 4 and 5, the LED package of the backlight for the LCD device according to the present invention includes a main body implementing a periphery with a recess in its central area, R, G and B LED chips mounted in the recess in the main body, conducting terminals connected to the R, G and B LED chips to apply voltages thereto, a first lens formed on the LED chips and having a first curvature, and a second lens formed at the edge and the central portion of the first lens, wherein its inner curved surface has a second curvature which is gradually increased from the edge portion toward the central portion and its outer curved surface has a third curvature which is gradually decreased from the edge portion toward the central portion.

That is, the third curvature of the outer curved surface of the second lens formed above the first lens is formed to be opposite to the second curvature of the inner curved surface of the second lens.

Other details can be understood from the aforementioned description.

Also, although an LED backlight for an LCD device which is implemented by modifying the first embodiment of the present invention is not shown in any separate drawing, it can be implemented in any of the following cases.

For example, when a poly-based PCB is arranged on a lower cover, at least one LED device may be separately disposed on the PCB, instead of the type of LED package having the LED chips therein. Here, a first lens formed on the LED device may be separately formed by an injection molding, instead of being formed of a gel-type elastic resin such as silicone.

Here, the first lens may be formed to have a certain uniform thickness such that a curvature of its inner curved surface is greater than the curvature of its outer curved surface. In the alternative, the first lens may be formed to have an outer curved surface with a certain curvature and an inner curved surface with a curvature which is gradually decreased from the central portion toward the edge portion such that the first lens is thicker from its central portion toward its edge portion.

Consequently, the inner curved surface and the outer curved surface of the first lens may be formed in hemispherical shapes, or the outer curved surface of the first lens may be hemispherical while the inner curved surface thereof may be oval.

After forming such thusly configured first lens on the LED device fixed onto the PCB, the second lens may be configured in the same manner as the first lens.

Accordingly, the outer curved surface of the second lens may also be hemispherical while its inner curved surface may be oval.

In one example, in accordance with the present invention, on the PCB having at least one LED device fixed thereonto is configured the first lens having the outer curved surface with the particular first curvature and the inner curved surface with the curvature which is gradually decreased from the central portion toward the edge. Afterwards, over the first lens is configured the second lens having an outer curved surface with the curvature which is smaller than the first curvature of the outer curved surface of the first lens and having an inner curved surface with a curvature which is gradually decreased from its central portion toward its edge.

Any appropriate combination of the aforesaid methods can implement the LED package and the backlight for an LCD device. The scope of the present invention is therefore intended to be embraced by the appended claims.

As described above, the LED package for a backlight for an LCD device according to the present invention can support light which is emitted more widely from the LED package which serves as a light source, so as to enable the enhancement of the overall color mixing and uniformity of the brightness.

What is claimed is:

1. A liquid crystal display device comprising:
a lower cover;
PCBs (Printed Circuit Boards) disposed on the lower cover for receiving power from the exterior;
a main body mounted on the PCBs;
R, G and B LED (Light Emitting Diode) devices disposed on the main body for emitting light;
a first lens having a first curvature and being mounted on the main body and housing the R, G and B LED devices;
a second lens covering an outside of the first lens, and having an inner curved surface with a second curvature having a varying radius of curvature, and an outer curved surface with a third curvature, wherein the second curvature of the inner curved surface is gradually increased from an edge portion thereof toward a central portion thereof; and
a liquid crystal panel spaced apart from the second lens with a certain interval and to which light is provided,
wherein the distance between the first lens and the inner curved surface of the second lens is increased from the edge portion thereof toward the central portion thereof and the distance between the outer curved surface of the first lens and the outer curved surface of the second lens is identical in the whole surface area of the first lens and the second lens.

2. The device of claim 1, wherein the LED device is an LED chip.

3. The device of claim 1, wherein the second lens has a thickness which becomes gradually thicker from the central portion toward the edge portion.

4. The device of claim 1, wherein the inner curved surface of the second lens is oval.

5. The device of claim 1, wherein the third curvature of the second lens is smaller than the first curvature of the first lens.

6. The device of claim 1, wherein the same interval is maintained between the outer curved surface of the first lens and the outer curved surface of the second lens.

7. The device of claim 1, wherein the first lens is formed of an elastic resin which is made of silicone.

8. The device of claim 1, wherein the second lens is of a poly-based resin.

9. The device of claim 1, wherein the outer curved surface of the second lens has a varying radius of curvature such that the third curvature of the outer curved surface is gradually decreased from the edge portion thereof toward the central portion thereof.

10. The device of claim 1, wherein the first curvature of the first lens is the same as the second curvature of the second lens.

11. A light emitting diode (LED) package comprising:
a main body having a recess in a central area thereof;
R, G and B LED devices disposed on the main body for emitting light;
a first lens having a first curvature and mounted on the main body and housing the R, G and B LED devices; and
a second lens covering an outside of the first lens, and having an inner curved surface with a second curvature having a varying radius of curvature, and an outer curved surface with a third curvature, wherein the second curvature of the inner curved surface is gradually increased from an edge portion thereof toward a central portion thereof and the third curvature of the outer curved surface is different from the second curvature of the inner curved surface,
wherein the distance between the first lens and the inner curved surface of the second lens is increased from the edge portion thereof toward the central portion thereof and the distance between the outer curved surface of the first lens and the outer curved surface of the second lens is identical in the whole surface area of the first lens and the second lens.

12. The package of claim 11, wherein the second lens has a thickness which becomes gradually thicker from the central portion toward the edge portion.

13. The package of claim 11, wherein the inner curved surface of the second lens is oval.

14. The package of claim 11, wherein the third curvature of the second lens is smaller than the first curvature of the first lens.

15. The package of claim 11, wherein the same interval is maintained between the outer curved surface of the first lens and the outer curved surface of the second lens.

16. The package of claim 11, wherein the first lens is formed of an elastic resin which is made of silicone.

17. The package of claim 11, wherein the second lens is of a poly-based resin.

18. The package of claim 11, wherein the outer curved surface of the second lens has a varying radius of curvature such that the third curvature of the outer curved surface is gradually decreased from the edge portion thereof toward the central portion thereof.

19. The package of claim 11, wherein the first curvature of the first lens is the same as the second curvature of the second lens.

* * * * *